United States Patent
Kudo et al.

(10) Patent No.: US 8,067,879 B2
(45) Date of Patent: Nov. 29, 2011

(54) PIEZOELECTRIC DEVICE

(75) Inventors: Hayami Kudo, Kyoto (JP); Yuichi Takamine, Ishikawa-gun (JP); Katsuhiro Ikada, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 11 days.

(21) Appl. No.: 12/836,595

(22) Filed: Jul. 15, 2010

(65) Prior Publication Data

US 2010/0277035 A1 Nov. 4, 2010

Related U.S. Application Data

(63) Continuation of application No. PCT/JP2009/050027, filed on Jan. 6, 2009.

(30) Foreign Application Priority Data

Jan. 17, 2008 (JP) .................................. 2008-008476

(51) Int. Cl.
H01L 41/053 (2006.01)
H03H 9/25 (2006.01)
(52) U.S. Cl. .................................... 310/340; 310/313 R
(58) Field of Classification Search .............. 310/313 R, 310/340
See application file for complete search history.

(56) References Cited

U.S. PATENT DOCUMENTS

2006/0174823 A1* 8/2006 Sung ................. 117/84

FOREIGN PATENT DOCUMENTS

| EP | 0 939 485 A1 | 9/1999 |
|---|---|---|
| JP | 10-12757 A | 1/1998 |
| JP | 11-251866 A | 9/1999 |
| JP | 2005-348273 A | 12/2005 |
| JP | 2006-180247 A | 7/2006 |
| JP | 2006-352430 A | 12/2006 |
| JP | 2007-19943 A | 1/2007 |
| JP | 2007-73595 A | 3/2007 |
| JP | 2007-318058 A | 12/2007 |

OTHER PUBLICATIONS

Official Communication issued in International Patent Application No. PCT/JP2009/050027, mailed on Mar. 24, 2009.

* cited by examiner

*Primary Examiner* — Thomas M Dougherty
(74) *Attorney, Agent, or Firm* — Keating & Bennett, LLP

(57) ABSTRACT

A piezoelectric device includes a piezoelectric substrate, a conductive pattern which is provided on one main surface of the piezoelectric substrate and which includes an IDT electrode, a supporting layer which is arranged on the one main surface of the piezoelectric substrate so as to surround the periphery of an IDT-forming region in which the IDT electrode is provided and which has a thickness greater than that of the IDT electrode, and a cover layer which is arranged on the supporting layer and which covers the IDT-forming region. The supporting layer includes removed sections provided at a plurality of positions at least in a region close to the IDT-forming region, the removed sections being obtained by partially removing a portion of the supporting layer to be bonded to the one main surface of the piezoelectric substrate.

14 Claims, 5 Drawing Sheets

PIEZOELECTRIC DEVICE

BACKGROUND OF THE INVENTION

1. Field of the Invention

The present invention relates to a piezoelectric device, and more particularly, to a piezoelectric device in which an element portion, such as a resonator or a filter, is disposed on a piezoelectric substrate.

2. Description of the Related Art

A piezoelectric device has been proposed in which in which an IDT electrode disposed on a piezoelectric substrate is covered with a cover layer.

For example, in a piezoelectric device 110 shown in a cross-sectional view in FIG. 8, on one main surface 111a of a piezoelectric substrate 111 having a conductive pattern including an IDT electrode 112, and pad electrodes 113, a frame-like supporting layer 120 made of a resin is arranged so as to surround an IDT-forming region where an IDT electrode 112 is arranged, and a cover layer 130 made of a resin is disposed on the supporting layer 120. Furthermore, the piezoelectric device 110 is entirely covered with an outer resin 140, and an IDT space 114 surrounding the IDT electrode 112 is sealed (see, for example, Japanese Unexamined Patent Application Publication No. 2006-352430).

In the piezoelectric device in which the IDT electrode is covered with the cover layer as described above, as shown in a perspective view of FIG. 6, the supporting layer 120 which supports the cover layer is spaced apart from the IDT electrode 112 so as not to adversely affect the region in which vibration propagates on the piezoelectric substrate 111 (the region in which the IDT electrode 112 is formed and its vicinity). The coefficient of linear expansion of the supporting layer 120 made of a resin is greater than the coefficient of linear expansion of the piezoelectric substrate 111. Therefore, when there is a change in temperature, thermal stress occurs between the piezoelectric substrate 111 and the supporting layer 120, and under the influence thereof, strain occurs in the region in which vibration propagates on the piezoelectric substrate 111, thus changing the vibration propagation state. As a result, temperature characteristics of the piezoelectric element including the IDT electrode 112 are degraded.

The degradation in temperature characteristics is believed to be improved by increasing the distance between the IDT electrode 112 and the supporting layer 120.

However, when a structure in which a supporting layer 120 is disposed close to an IDT electrode 112 on a piezoelectric substrate 111, as shown in FIG. 7A which is a cross-sectional view of a main portion, is changed to a structure in which a supporting layer 120x is spaced away from the IDT electrode 112 such that the distance between the IDT electrode 112 and the supporting layer 120x is increased as shown in FIG. 7B which is a cross-sectional view of a main portion, a cover layer 130 on the supporting layer 120x sags and attaches to the IDT electrode 112, which degrades characteristics. In particular, in the case in which molding is performed with a resin, the cover layer 130 easily sags under pressure during molding, and characteristics are significantly degraded.

Furthermore, because of the increase in the distance between the IDT electrode and the supporting layer, design freedom is reduced. In addition, the size of piezoelectric devices cannot be reduced.

SUMMARY OF THE INVENTION

To overcome the problems described above, preferred embodiments of the present invention provide a piezoelectric device in which temperature characteristics can be improved without changing the distance between an IDT electrode and a supporting layer.

A piezoelectric device according to a preferred embodiment of the present invention includes a piezoelectric substrate, a conductive pattern which is provided on one main surface of the piezoelectric substrate and which includes an IDT electrode, a supporting layer which is arranged on the one main surface of the piezoelectric substrate so as to surround the periphery of an IDT-forming region in which the IDT electrode is provided and which has a thickness greater than that of the IDT electrode, and a cover layer which is arranged on the supporting layer and which covers the IDT-forming region. The supporting layer includes removed sections provided at a plurality of positions at least in a region close to the IDT-forming region, the removed sections being obtained by partially removing a portion of the supporting layer to be bonded to the one main surface of the piezoelectric substrate.

Since the supporting layer includes the removed sections provided in the region close to the IDT-forming region, the bonding area between the supporting layer and the piezoelectric substrate is decreased in the region close to the IDT-forming region. Thereby, thermal stress is reduced, and the influence of thermal stress on the region in which vibration propagates on the piezoelectric substrate (the IDT-forming region and its vicinity) is decreased. Therefore, the temperature characteristics of the piezoelectric device are improved.

The removed sections provided in the supporting layer can be configured according to various preferred embodiments of the present invention.

According to one preferred embodiment of the present invention, the removed sections are defined by a plurality of slits arranged so as to extend from an opening, which is provided in the inner peripheral surface facing the IDT region of the supporting layer, in a direction away from the IDT-forming region.

In this case, in the region of the supporting layer close to the IDT-forming region, the area of the piezoelectric substrate which the supporting layer is bonded to is significantly decreased by the slits. Therefore, the temperature characteristics are greatly improved.

According to another preferred embodiment, the removed sections are defined by holes, the entire circumference of each of which is surrounded by the supporting layer.

In this case, when viewed in perspective in a direction perpendicular to one main surface of the piezoelectric substrate, for example, a plurality of holes may preferably be arranged in one line or in two or more lines along the outer periphery of the IDT-forming region. Alternatively, strip-shaped long holes may be arranged so as to extend along the outer periphery of the IDT-forming region.

Preferably, the removed sections pass through the supporting layer between two main surfaces in contact with the piezoelectric substrate and the cover layer.

The removed sections passing through the supporting layer can be formed in the same process as that for patterning of the supporting layer, without adding an additional step.

Preferably, the supporting layer is made of a photosensitive resin.

In this case, the supporting layer can be formed with high accuracy by a photolithographic technique, for example.

Preferably, the supporting layer is made of a photosensitive polyimide resin.

By using the photosensitive polyimide resin, high reliability can be ensured.

Preferably, the supporting layer is made of a photosensitive silicone resin.

By using the photosensitive silicone resin, a low-temperature curing process may be used.

Preferably, the supporting layer is made of a photosensitive epoxy resin.

By using the epoxy resin, a supporting layer with higher resolution can be formed. Furthermore, a low-temperature curing process may be used.

Preferably, the cover layer is made an epoxy film resin.

By using the epoxy film resin, a low-temperature curing process may be used.

Preferably, the cover layer is made of a polyimide film resin.

By using the polyimide film resin, high reliability can be ensured.

Preferably, the piezoelectric device further includes a via hole which is formed by subjecting the supporting layer and the cover layer to laser machining at one time, for example.

In this case, the via hole can be formed with high accuracy at low cost.

Preferably, the piezoelectric device further includes a via hole which is formed by subjecting the supporting layer and the cover layer to sandblasting at one time, for example.

In this case, the via hole can be formed at low cost.

Preferably, the piezoelectric device further includes a via hole which passes through the supporting layer and the cover layer, and an under-bump metal formed by Au/Ni electrolytic plating in the via hole.

In this case, the under-bump metal can be accurately formed.

Preferably, the piezoelectric device includes at least two items selected from the group consisting of (i) the supporting layer made of at least one of a photosensitive resin, a photosensitive polyimide resin, a photosensitive silicone resin, and a photosensitive epoxy resin, for example, (ii) the cover layer made of at least one of an epoxy film resin and a polyimide film resin, for example, and (iii) a via hole formed by subjecting the supporting layer and the cover layer to laser machining or sandblasting at one time.

According to various preferred embodiments of the present invention, it is possible to improve temperature characteristics of a piezoelectric device without changing the distance between an IDT electrode and a supporting layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to FIGS. 1 to 5.

Figure 1:
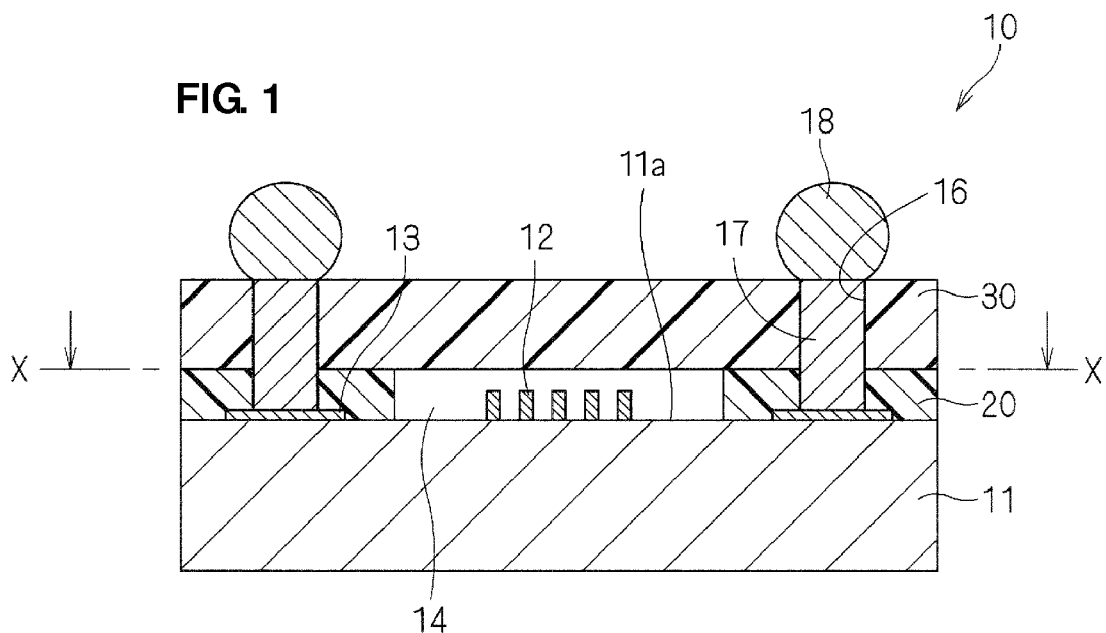
FIG. 1 is a cross-sectional view of a piezoelectric device according to a preferred embodiment of the present invention.

FIG. 1 is a cross-sectional view of a piezoelectric device 10. As shown in FIG. 1, the piezoelectric device 10 is a surface acoustic wave (SAW) filter in which an element portion is disposed on a piezoelectric substrate 11. An upper surface 11a, which is one main surface of the piezoelectric substrate 11, is provided with a conductive pattern including an interdigital transducer (IDT) electrode 12, which is a comb-shaped electrode, pad electrodes 13, and wiring (not shown) extending between the IDT electrode 12 and the pad electrodes 13. A supporting layer is arranged in a frame shape in the periphery of an IDT-forming region in which the IDT electrode 12 is provided. The thickness of the supporting layer 20 is greater than the thickness of the conductive pattern, such as the IDT electrode 12. The supporting layer 20 is also disposed on the pad electrodes 13.

A cover layer 30 is arranged on the supporting layer 20, and the surroundings of the IDT electrode 12 provided on the piezoelectric substrate 11 are covered with the supporting layer and the cover layer 30 which are insulating members to provide an IDT space 14. In the upper surface 11a of the piezoelectric substrate 11, surface acoustic waves freely propagate in a portion adjacent to the IDT space 14.

As shown in FIG. 1, via holes (through holes) 16 which extend to the pad electrodes 13 provided on the upper surface 11a of the piezoelectric substrate 11 are provided in the supporting layer 20 and the cover layer 30. Each of the via holes 16 is filled with an under-bump metal 17, and a solder bump 18 which is exposed to the outside is provided on the under-bump metal 17.

The piezoelectric device 10 is, for example, used as a portion of a module, and after a plurality thereof are mounted on a substrate, the periphery is molded with a resin.

Figure 2:
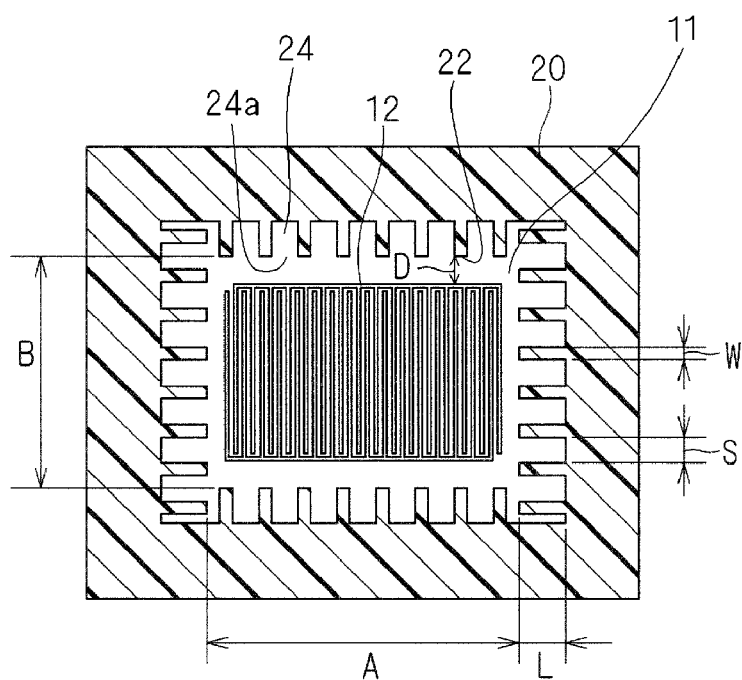
FIG. 2 is a cross-sectional view of the piezoelectric device shown in FIG. 1.

FIG. 2 is a schematic cross-sectional view taken along the line X-X in FIG. 1. In FIG. 2, the via holes 16 and the under-bump metal 17 are omitted.

As shown in FIG. 2, the supporting layer 20 includes a plurality of slits 24 provided as removed sections in a portion close to the IDT-forming region in which the IDT electrode 12 is provided. The slits 24 are arranged in a comb shape, i.e., in parallel to each other with a predetermined distance therebetween, and extend from an opening 24a provided in the inner peripheral surface 22 of the supporting layer 20 in a direction extending away from the IDT-forming region. The slits 24 are provided at least in the portion close to the IDT-forming region and the slits may extend to a portion distant from the IDT-forming region.

By forming the slits 24 in the supporting layer 20, the bonding area between the supporting layer 20 and the piezoelectric substrate 11 is decreased. Thereby, thermal stress is reduced, and the influence of thermal stress on the region in which vibration propagates on the piezoelectric substrate 11 (the IDT-forming region and its vicinity) is decreased, and therefore, it is possible to improve the temperature characteristics.

Next, a specific manufacturing example of a piezoelectric device 10 will be described. A plurality of piezoelectric devices 10 are collectively manufactured as a collective substrate.

First, a conductive pattern including an IDT electrode 12 and pad electrodes 13 is formed on a piezoelectric substrate 11. The conductive pattern is formed using a method capable of achieving height accuracy and surface flatness, such as a vapor-deposited metal film with a thickness of about 1 μm to about 2 μm, for example. An element portion having the IDT electrode 12 and element wiring to be connected to the IDT electrode 12 is formed with the conductive pattern.

Next, a $SiO_2$ film or a two-layered film of $SiN/SiO_2$ is preferably formed by sputtering, for example, on the surface of the element portion. In portions, such as pad electrodes 13 defining underlying electrodes for an under-bump metal 17, from which the $SiO_2$ film and the SiN film are required to be removed, the $SiO_2$ film and the SiN film are preferably removed by dry etching, for example.

Next, in order to form an IDT space 14 and slits 24, a supporting layer 20 is formed so as not to overlap the vibration portion. That is, for example, a photosensitive polyimide resin is applied onto the piezoelectric substrate 11, the IDT space 14 (a portion directly above the IDT electrode 12 and a periphery of the IDT electrode 12 in a range of about 5 μm to about 15 μm, for example) and the slits 24 are formed by a photolithographic technique, and at the same time, a region with a width of about 100 μm, for example, having a dicing line in the approximate center thereof is also provided. In FIG. 2, the size of the IDT space 14 represented by symbols A and B is preferably in a range of about 50 μm×about 50 μm to about 1000 μm×about 400 μm, for example. Although the photosensitive polyimide resin is used for the supporting layer 20, a photosensitive epoxy or photosensitive silicone resin may be used. The thickness of the supporting layer 20 is preferably about 15 μm, but may be in a range of about 10 μm to about 30 μm, for example.

Next, a cover layer 30 is formed, for example, by lamination on the supporting layer 20. Then, in portions to which solder balls defining external terminals are to be connected, the cover layer 30 and the supporting layer 20 are removed by laser machining to form via holes 16 with a diameter of about 50 μm to about 150 μm. Although a non-photosensitive epoxy film resin is used for the cover layer 30, a non-photosensitive polyimide film may be used. The thickness of the cover layer 30 preferably is about 30 μm, but may be in a range of about 30 μm to about 50 μm. Furthermore, the via holes 16 may be formed by sandblasting. The portions of the via holes 16 located in the supporting layer 20 may be formed in the photolithography step in the process of forming the supporting layer 20.

Organic substances on the surface of the pad electrodes 13 exposed to the bottoms of the via holes 16 are removed by dry etching. Then, the via holes 16 are filled with Cu, Ni, or other suitable material by electrolytic plating, for example, and Au (about 20 μm to about 1000 nm thick) for oxidation prevention is preferably electrolytically plated on the surface to form an under-bump metal 17, for example. The under-bump metal 17 may preferably be formed by electroless plating, for example. The surface of the under-bump metal 17 is formed so as to recede (be concave) from the surface of the cover layer 30 within a range of about 0 μm to about 10 μm.

Next, a solder paste of Sn—Ag—Cu or other suitable material is printed immediately above the under-bump metal 17 through a metal mask, and the solder is fixed to the under-bump metal 17 by heating at a temperature at which the solder paste is melted, for example, at about 260° C. Flux is removed with a flux cleaner, and thereby, spherical solder bumps 18 are formed.

Then, chips (individual pieces) are cut out by a method, such as dicing, for example. A piezoelectric device 10 is thereby completed.

Figure 3:
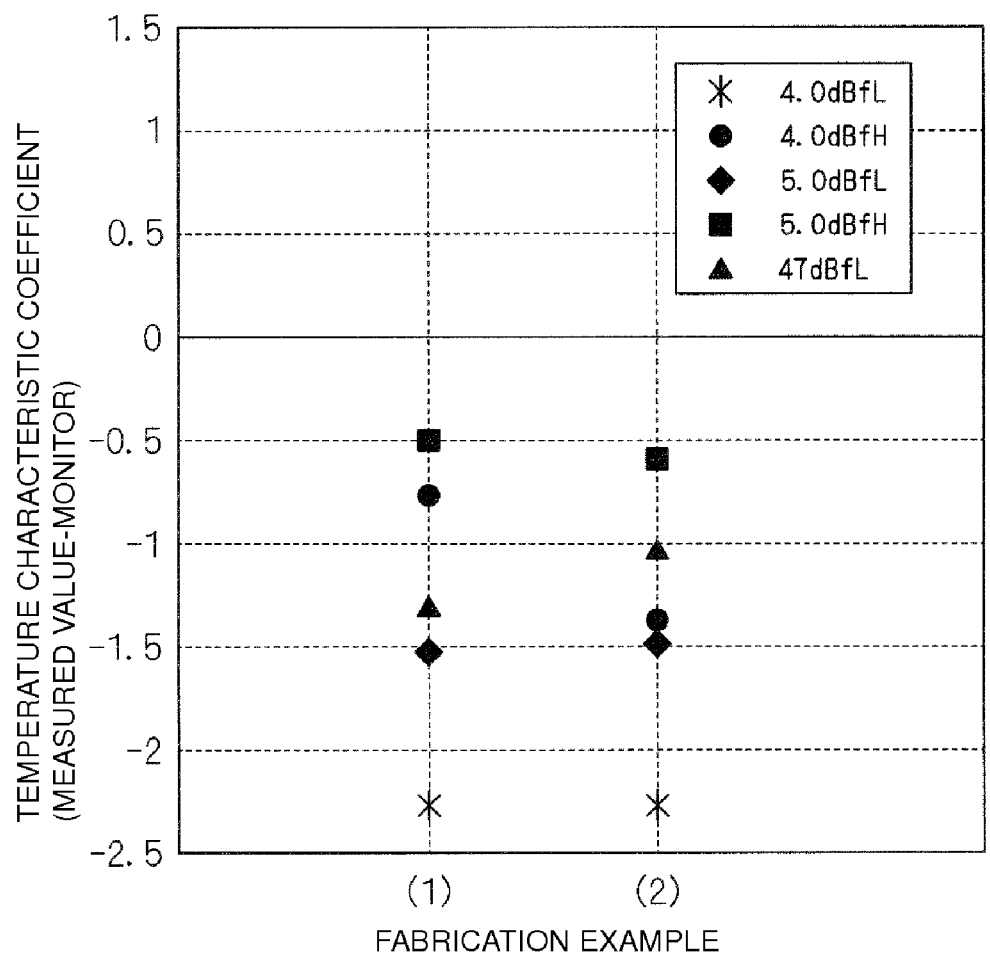
FIG. 3 is a graph showing temperature characteristics the piezoelectric devices shown in FIG. 1.

A graph of FIG. 3 shows differences in the temperature coefficient between each of SAW filters of Fabrication Examples (1) and (2) and a SAW filter of Comparative Example which is the same as the SAW filter of Fabrication Example (1) or (2) except for the absence of slits.

In Fabrication Examples (1) and (2), the sizes of the IDT space 14 and slits 24 formed in the photolithography step in the process of forming the supporting layer, which are illustrated in FIG. 2, are as follows:

IDT space size (A×B): about 50 μm×about 50 μm in each of Fabrication Examples (1) and (2)

Slit length (L): about 15 μm in each of Fabrication Examples (1) and (2)

Slit spacing (W): about 20 μm in Fabrication Example (1) and about 50 μm in Fabrication Example (2)

Slit width (S): about 50 μm in each of Fabrication Examples (1) and (2)

Distance (D) between IDT-forming region and supporting layer: about 30 μm in each of Fabrication Examples (1) and (2)

In FIG. 3, the vertical axis represents the level of each of Fabrication Examples (1) and (2) relative to Comparative Example (temperature coefficient=0), and its units of measure are ppm/° C. A lower value relative to the standard (=0) indicates a larger temperature improvement. The asterisk (4.0 dBfL) represents the data at a point on the low frequency side in which the filter characteristic is at a level 4.0 dB lower than the through level. The solid circle (4.0 dBfH) represents the data at a point on the high frequency side in which the filter characteristic is at a level 4.0 dB lower than the through level. The solid diamond (5.0 dBfL) represents the data at a point on the low frequency side in which the filter characteristic is at a level 5.0 dB lower than the through level. The solid square (5.0 dBfH) represents the data at a point on the high frequency side in which the filter characteristic is at a level 5.0 dB lower than the through level. The solid triangle (47 dBfL) represents the data at a point on the low frequency side in which the filter characteristic is at a level 47 dB lower than the through level.

As shown in the graph of FIG. 3, by providing slits 24, the temperature coefficient decreases, and it is possible to improve temperature characteristics without changing the distance between the IDT electrode and the supporting layer.

A preferred embodiment of the removed sections provided in a supporting layer will be described with reference to FIG. 4.

Figure 4:
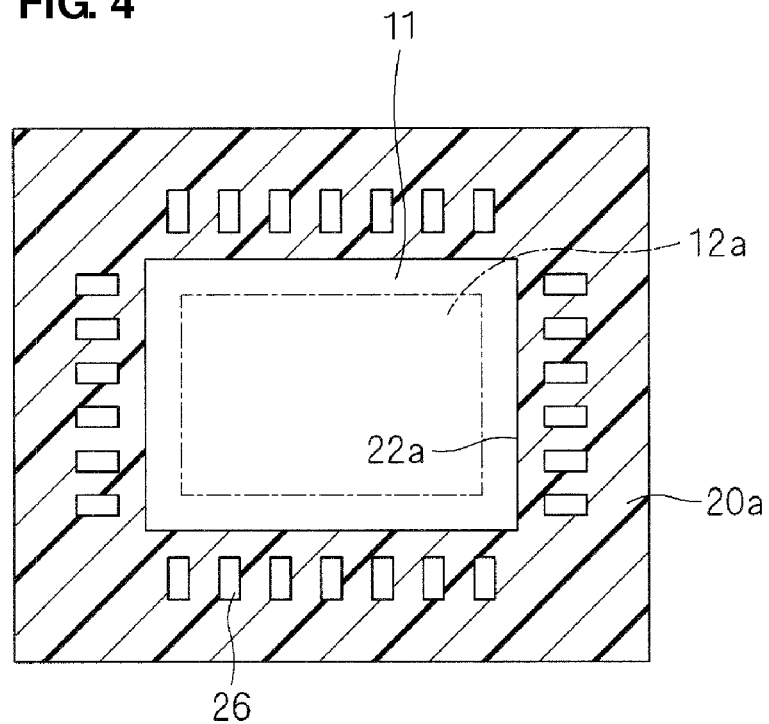
FIG. 4 is a cross-sectional view of a piezoelectric device according to another preferred embodiment of the present invention.

FIG. 4 is a cross-sectional view schematically showing a cross-section of a supporting layer 20a taken along the piezoelectric substrate 11 as in FIG. 2. As shown in FIG. 4, the supporting layer 20a which surrounds an IDT-forming region 12a in which the IDT electrode is provided includes a plurality of holes 26 defining removed sections in a portion close to the IDT-forming region 12a. The holes 26 are spaced away from the inner peripheral surface 22a of the supporting layer 20a, and the entire circumference of each of the holes 26 is surrounded by the supporting layer 20a. FIG. 4 illustrates an example in which the holes 26 are arranged in one line along the inner peripheral surface 22b of the supporting layer 20b. However, the holes may be arranged in various ways, and for example, may be arranged in two or more lines and may be arranged in a scattered pattern. Furthermore, the holes are arranged at least in the portion close to the IDT-forming region 12a and may also be arranged in the portion distant from the IDT-forming region 12a.

By forming the holes 26 in the supporting layer 20a, the bonding area between the supporting layer 20a and the piezoelectric substrate 11 is decreased. Thereby, thermal stress is reduced, and the influence of thermal stress on the region in which vibration propagates on the piezoelectric substrate 11 (the IDT-forming region 12a and its vicinity) is decreased. Therefore, the temperature characteristics are improved.

Another preferred embodiment of the removed sections provided in a supporting layer will be described with reference to FIG. 5.

Figure 5:
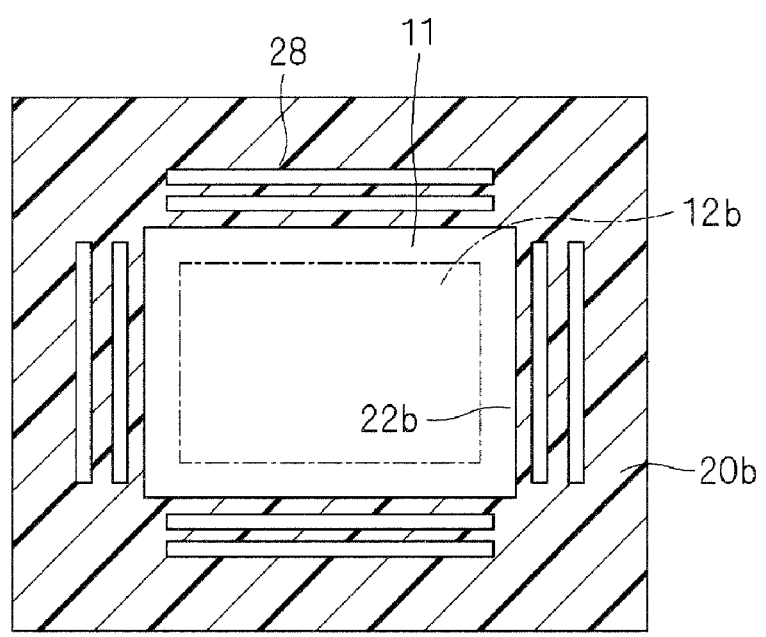
FIG. 5 is a cross-sectional view of a piezoelectric device according to another preferred embodiment of the present invention.
Figure 6:
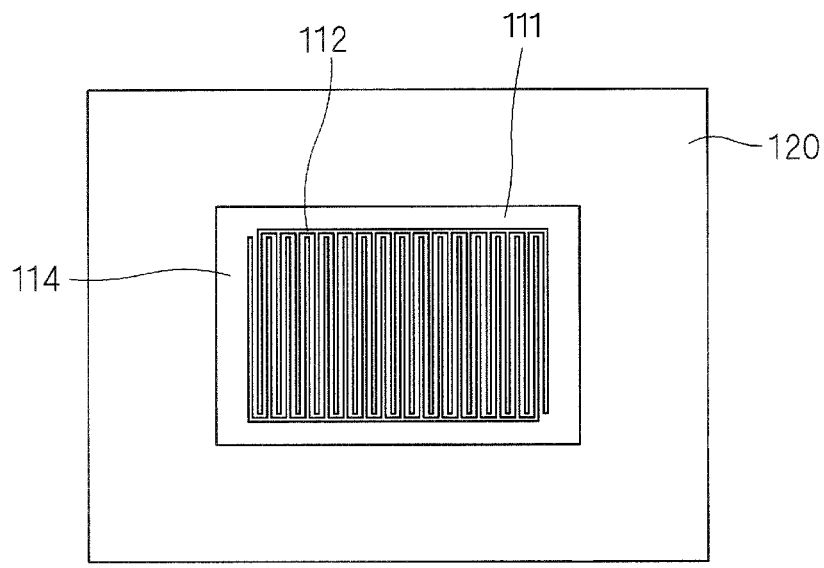
FIG. 6 is a perspective view of a known piezoelectric device.
Figure 7A:
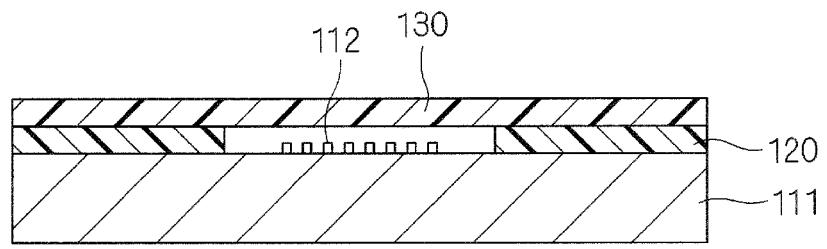
FIGS. 7A and 7B include cross-sectional views, each showing a main portion of the piezoelectric device shown in FIG. 6.
Figure 7B:
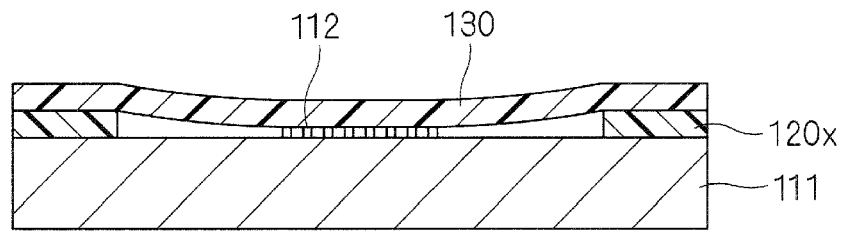

FIG. 5 is a cross-sectional view schematically showing a cross-section of a supporting layer 20b taken along the piezoelectric substrate 11 as in FIG. 2. As shown in FIG. 5, the supporting layer 20b which surrounds an IDT-forming region 12b in which the IDT electrode is provided includes a plurality of long holes 28 defining removed sections in a portion close to the IDT-forming region 12b. The long holes 28 are spaced away from the inner peripheral surface 22b of the supporting layer 20b, and the entire circumference of each of the long holes 28 is surrounded by the supporting layer 20b. The long holes 28 extend along the inner peripheral surface 22b of the supporting layer 20b such that the longitudinal direction of the long holes is in parallel or substantially parallel to the inner peripheral surface 22b. FIG. 5 illustrates an example in which the long holes 28 are arranged in two lines. However, the long holes may be arranged in various ways, and for example, may be arranged in one line or three or more lines. Furthermore, the long holes are arranged at least in the portion close to the IDT-forming region 12a and may be also arranged in the portion distant from the IDT-forming region 12a.

By forming the long holes 28 in the supporting layer 20b, the bonding area between the supporting layer 20b and the piezoelectric substrate 11 is decreased. Thereby, thermal stress is reduced, and the influence of thermal stress on the region in which vibration propagates on the piezoelectric substrate 11 (the IDT-forming region 12b and its vicinity) is decreased. Therefore, it is possible to improve temperature characteristics.

As described above, by providing slits, holes, or long holes as removed sections in the supporting layer, the temperature characteristics are improved without changing the distance between the IDT electrode and the supporting layer. The slits, holes, or long holes can be formed in the same process as that for patterning of the supporting layer without adding an additional step.

Furthermore, the present invention is not limited to the preferred embodiments described above, and various modifications are possible.

Figure 8:
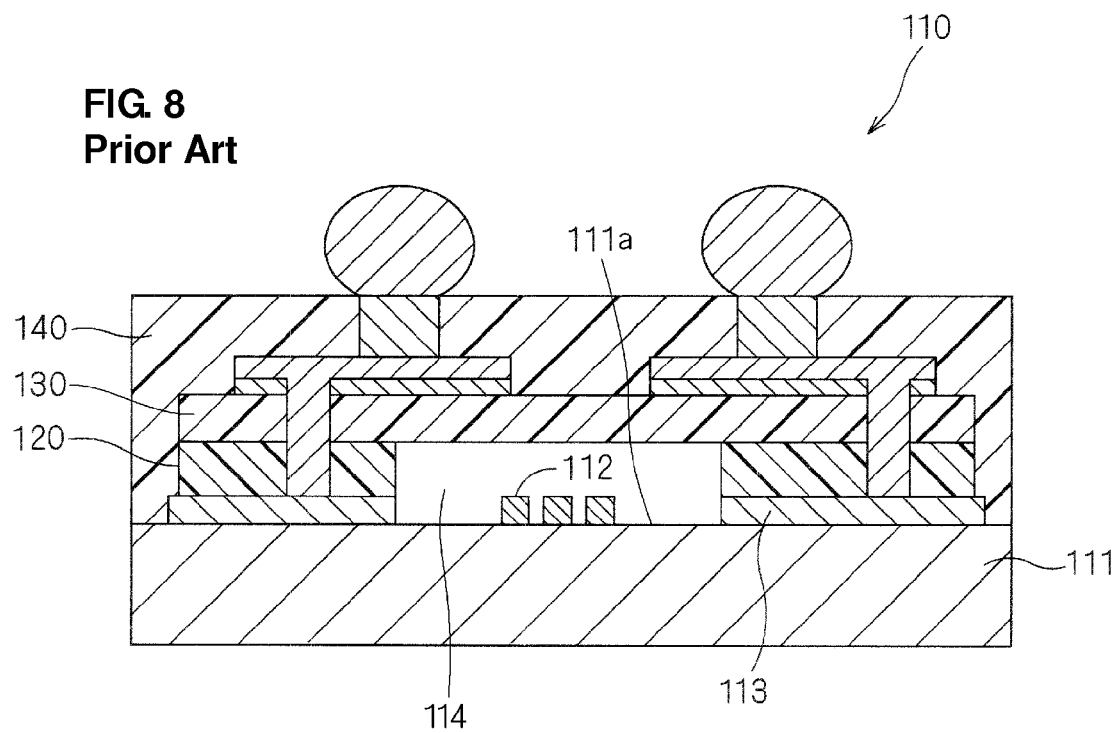
FIG. 8 is a cross-sectional view of a known piezoelectric device.

For example, preferred embodiments of the present invention may be applied to a piezoelectric device which is sealed with an outer resin as in the conventional example shown in FIG. 8, and removed sections may be provided in the supporting layer supporting the cover layer. Not only a SAW element, but also an element portion, such as a boundary wave element, may be provided on the piezoelectric substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric device comprising:
a piezoelectric substrate;
a conductive pattern provided on one main surface of the piezoelectric substrate and including an interdigital transducer electrode;
a supporting layer arranged on the one main surface of the piezoelectric substrate so as to surround the periphery of an interdigital transducer-forming region in which the interdigital transducer electrode is provided and having a thickness greater than that of the interdigital transducer electrode; and
a cover layer arranged on the supporting layer and covering the IDT-forming region; wherein
the supporting layer includes removed sections provided at a plurality of positions at least in a region close to the interdigital transducer-forming region, the removed sections being obtained by partially removing a portion of the supporting layer to be bonded to the one main surface of the piezoelectric substrate.

2. The piezoelectric device according to claim 1, wherein the removed sections include a plurality of slits arranged so as to extend from an opening which and being provided in the inner peripheral surface facing the IDT region of the supporting layer, in a direction extending away from the IDT-forming region.

3. The piezoelectric device according to claim 1, wherein the removed sections include holes in which an entire circumference of each of the holes is surrounded by the supporting layer.

4. The piezoelectric device according to claim 1, wherein the removed sections extend through the supporting layer between two main surfaces of the supporting layer in contact with the piezoelectric substrate and the cover layer.

5. The piezoelectric device according to claim 1, wherein the supporting layer is made of a photosensitive resin.

6. The piezoelectric device according to claim 1, wherein the supporting layer is made of a photosensitive polyimide resin.

7. The piezoelectric device according to claim 1, wherein the supporting layer is made of a photosensitive silicone resin.

8. The piezoelectric device according to claim 1, wherein the supporting layer is made of a photosensitive epoxy resin.

9. The piezoelectric device according to claim 1, wherein the cover layer is made of an epoxy film resin.

10. The piezoelectric device according to claim 1, wherein the cover layer is made of a polyimide film resin.

11. The piezoelectric device according to claim 1, further comprising a laser-machined via hole extending through the supporting layer and the cover layer.

12. The piezoelectric device according to claim 1, further comprising a sandblasted via hole which extending through the supporting layer and the cover layer.

13. The piezoelectric device according to claim 1, further comprising:
a via hole extending through the supporting layer and the cover layer; and
an Au/Ni electrolytically plated under-bump metal disposed in the via hole.

14. The piezoelectric device according to claim 1, wherein the piezoelectric device includes at least two elements selected from the group consisting of:
the supporting layer made of at least one of a photosensitive resin, a photosensitive polyimide resin, a photosensitive silicone resin, and a photosensitive epoxy resin;
the cover layer made of at least one of an epoxy film resin and a polyimide film resin; and
a laser-machined or sandblasted via hole provided in the supporting layer and the cover layer.

* * * * *